United States Patent [19]
Reed et al.

[11] Patent Number: 5,961,658
[45] Date of Patent: *Oct. 5, 1999

[54] PR4 EQUALIZATION AND AN EPR4 REMOD/DEMOD SEQUENCE DETECTOR IN A SAMPLED AMPLITUDE READ CHANNEL

[75] Inventors: David E. Reed, Westminster; William G. Bliss, Thornton; Lisa C. Sundell, Westminster, all of Colo.

[73] Assignee: Cirrus Logic, Inc., Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/862,492

[22] Filed: May 23, 1997

[51] Int. Cl.$^6$ .......................... G11B 20/18; H03M 13/00; H03M 13/12

[52] U.S. Cl. .............................. 714/746; 360/40; 360/41; 360/53; 714/786; 714/788; 714/824

[58] Field of Search .................................... 371/30, 37.01, 371/37.06, 45, 43.6, 43.7, 49.1, 51.1, 53, 55, 56, 67.1, 71, 43.1; 375/263, 264, 265; 369/59; 360/39, 40, 41, 53

[56] References Cited

U.S. PATENT DOCUMENTS

| | | | |
|---|---|---|---|
| 5,521,945 | 5/1996 | Knudson | 375/341 |
| 5,585,975 | 12/1996 | Bliss | 360/65 |
| 5,619,539 | 4/1997 | Coker et al. | 375/341 |
| 5,689,532 | 11/1997 | Fitzpatrick | 375/341 |
| 5,760,984 | 6/1998 | Spurbeck et al. | 360/51 |
| 5,768,320 | 6/1998 | Kovacs et al. | 375/341 |
| 5,771,127 | 6/1998 | Reed et al. | 360/51 |
| 5,774,286 | 6/1998 | Shimoda | 360/46 |
| 5,774,470 | 6/1998 | Nishiya et al. | 371/3 |
| 5,844,741 | 12/1998 | Yamakawa et al. | 360/65 |

OTHER PUBLICATIONS

Bahl et al, "Optimal Decoding of Linear Codes for Minimizing Symbol Error Rate", *IEEE Trans. on Information Theory*, Mar., 1974.

J. Hagenauer and P. Hoeher, "A Viterbi Algorithm with Soft–Decision Outputs and its Applications", Conference Proceedings, IEEE Globecom, Dallas, TX, Nov., 1989.

Peter A. McEwen and Jack K. Wolf, "Trellis Codes for (1,k) E2PR4ML with Squared Distance 18", *IEEE Transactions on Magnetics*, vol. 32, No. 5, Sep. 1996.

Roger Wood, "Turbo–PRML: A Compromise EPRML Detector," *IEEE Transactions on Magnetics*, vol. 29, No. 6, Nov. 1993.

Hideyuki Yamakawa, "SPERD: Simplified Partial Error Response Detection," *IEEE Inter Mag '95*, San Antonio, Texas, Apr. 1993.

Takushi Nishiya, "PERD: Partial Error Response Detection," *IEEE Inter Mag '95*, San Antonio, Texas, Apr. 1995.

Takushi Nishiya and Hideyuki Yamakawa, "PERD: Partial Error Response Detection," *IEEE Transactions on Magnetics*, vol. 31, No. 6, Nov. 1995.

*Primary Examiner*—Stephen M. Baker
*Attorney, Agent, or Firm*—Howard H. Sheerin; Dan S. Shifrin

[57] ABSTRACT

A sampled amplitude read channel is disclosed for disk storage systems that employs an EPR4 remod/demod sequence detector. To reduce the complexity of timing recovery, gain control and adaptive equalization, the channel samples are initially equalized into a PR4 partial response so that a simple slicer circuit can generate estimated sample values. The PR4 equalized channel samples are then passed through a 1+D filter to generate EPR4 equalized channel samples which are processed by an EPR4 Viterbi sequence detector to generate a preliminary binary sequence. The preliminary binary sequence is remodulated into an estimated or ideal PR4 sample sequence which is subtracted from the PR4 equalized channel samples to generate an error sample sequence. An error pattern detector processes the error sample sequence to detect the dominant error events associated with the EPR4 Viterbi sequence detector.

22 Claims, 12 Drawing Sheets

PR4 EQUALIZATION AND AN EPR4 REMOD/DEMOD SEQUENCE DETECTOR IN A SAMPLED AMPLITUDE READ CHANNEL

CROSS REFERENCE TO RELATED APPLICATIONS AND PATENTS

This application is related to other U.S. patent applications, namely application Ser. No. 08/681,678 entitled "A Sampled Amplitude Read Channel Employing Interpolated Timing Recovery and a Remod/Demod Sequence Detector", now U.S. Pat. Nos. 5,771,127, 08/681, 692 entitled "A Rate 16/17 ENDEC With Independent High/Low Byte Decoding", now U.S. Pat. No. 5,717,395 and 08/640,351 entitled "Adaptive Equalization and Interpolated Timing Recovery in a Sampled Amplitude Read Channel for Magnetic Recording." This application is also related to several U.S. patents, namely U.S. Pat. No. 5,359, 631 entitled "Timing Recovery Circuit for Synchronous Waveform Sampling," U.S. Pat. No. 5,291,499 entitled "Method and Apparatus for Reduced-Complexity Viterbi-Type Sequence Detectors," U.S. Pat. No. 5,297,184 entitled "Gain Control Circuit for Synchronous Waveform Sampling," U.S. Pat. No. 5,329,554 entitled "Digital Pulse Detector," U.S. Pat. No. 5,576,904 entitled "Timing Gradient Smoothing Circuit in a Synchronous Read Channel," U.S. Pat. No. 5,585,975 entitled "Equalization for Sample Value Estimation and Sequence Detection in a Sampled Amplitude Read Channel," and U.S. Pat. No. 5,424,881 entitled "Synchronous Read Channel." All of the above-named patent applications and patents are assigned to the same entity, and all are incorporated herein by reference.

FIELD OF INVENTION

The present invention relates to the control of storage systems for digital computers (such as magnetic and optical disk drives), particularly to a sampled amplitude read channel that employs PR4 equalization and an EPR4 remod/demod sequence detector.

BACKGROUND OF THE INVENTION

Computer storage systems (such as optical, magnetic, and the like) record digital data onto the surface of a storage medium, which is typically in the form of a rotating magnetic or optical disk, by altering a surface characteristic of the disk. The digital data serves to modulate the operation of a write transducer (write head) which records binary sequences onto the disk in radially concentric or spiral tracks. In magnetic recording systems, for example, the digital data modulates the current in a write coil in order to record a series of magnetic flux transitions onto the surface of a magnetizable disk. And in optical recording systems, for example, the digital data may modulate the intensity of a laser beam in order to record a series of "pits" onto the surface of an optical disk. When reading this recorded data, a read transducer (read head), positioned in close proximity to the rotating disk, detects the alterations on the medium and generates a sequence of corresponding pulses in an analog read signal. These pulses are then detected and decoded by read channel circuitry in order to reproduce the digital sequence.

Detecting and decoding the pulses into a digital sequence can be performed by a simple peak detector in a conventional analog read channel or, as in more recent designs, by a discrete-time sequence detector in a sampled amplitude read channel. Discrete-time sequence detectors are preferred over simple analog pulse detectors because they compensate for intersymbol interference (ISI) and are less susceptible to channel noise. Consequently, discrete-time sequence detectors increase the capacity and reliability of the storage system. There are several well known discrete-time sequence detection methods including discrete-time pulse detection (DPD), partial response (PR) with Viterbi detection, maximum likelihood sequence detection (MLSD), decision-feedback equalization (DFE), enhanced decision-feedback equalization (EDFE), and fixed-delay tree-search with decision-feedback (FDTS/DF).

Unlike conventional peak detection systems, sampled amplitude recording detects digital data by interpreting, at discrete-time instances, the actual value of the pulse data. To this end, the read channel comprises a sampling device for sampling the analog read signal, and a timing recovery circuit for synchronizing the samples to the baud rate (code bit rate). Before sampling the pulses, a variable gain amplifier adjusts the read signal's amplitude to a nominal value, and a low pass analog filter filters the read signal to attenuate channel and aliasing noise. After sampling, a digital equalizer equalizes the sample values according to a desired partial response, and a discrete-time sequence detector, such as a Viterbi detector, interprets the equalized sample values in context to determine a most likely sequence for the digital data (i.e., maximum likelihood sequence detection (MLSD)). MLSD takes into account the effect of ISI and channel noise in the detection algorithm, thereby decreasing the probability of a detection error. This increases the effective signal to noise ratio and, for a given (d,k) constraint, allows for significantly higher data density as compared to conventional analog peak detection read channels.

The application of sampled amplitude techniques to digital communication channels is well documented. See Y. Kabal and S. Pasupathy, "Partial Response Signaling", *IEEE Trans. Commun. Tech.*, Vol. COM-23, pp.921–934, September 1975; and Edward A. Lee and David G. Messerschmitt, "Digital Communication", Kluwer Academic Publishers, Boston, 1990; and G. D. Forney, Jr., "The Viterbi Algorithm", *Proc. IEEE*, Vol. 61, pp. 268–278, March 1973.

Applying sampled amplitude techniques to magnetic storage systems is also well documented. See Roy D. Cideciyan, Francois Dolivo, Walter Hirt, and Wolfgang Schott, "A PRML System for Digital Magnetic Recording", *IEEE Journal on Selected Areas in Communications*, Vol. 10 No. 1, January 1992, pp.38–56; and Wood et al, "Viterbi Detection of Class IV Partial Response on a Magnetic Recording Channel", *IEEE Trans. Commun.*, Vol. Com-34, No. 5, pp. 454–461, May 1986; and Coker Et al, "Implementation of PRML in a Rigid Disk Drive", *IEEE Trans. on Magnetics*, Vol. 27, No. 6, November 1991; and Carley et al, "Adaptive Continous-Time Equalization Followed By FDTS/DF Sequence Detection", *Digest of The Magnetic Recording Conference*, August 15–17, 1994, pp. C3; and Moon et al, "Constrained-Complexity Equalizer Design for Fixed Delay Tree Search with Decision Feedback", *IEEE Trans. on Magnetics*, Vol. 30, No. 5, September 1994; and Abbott et al, "Timing Recovery For Adaptive Decision Feedback Equalization of The Magnetic Storage Channel", *Globecom'90 IEEE Global Telecommunications Conference* 1990, San Diego, Calif., November 1990, pp.1794–1799; and Abbott et al, "Performance of Digital Magnetic Recording with Equalization and Offtrack Interference", *IEEE Transactions on Magnetics*, Vol. 27, No. 1, January 1991; and Cioffi et al, "Adaptive Equalization in Magnetic-Disk Storage Channels", *IEEE Communication Magazine*, February 1990; and Roger Wood, "Enhanced Decision Feedback Equalization", *Intermag'90*.

It is a general perception in the prior art that higher order read channels provide an increase in performance because less equalization is required to match the read signal to the desired partial response, and because higher order read channels tend to perform better at higher data densities. However, the trade-off in higher order read channels is the increase in complexity. For example, a Partial Response Class-IV (PR4) read channel, which has a transfer function of $1-D^2$, can be implemented simply as a pair of two-state sliding threshold detectors (see the above referenced paper entitled "A PRML System for Digital Magnetic Recording"), but it exhibits a loss in performance due to the amount of equalization required to match the read signal to the PR4 response. An Extended Partial Response Class-IV (EPR4) read channel, which has a transfer function of $(1-D)(1+D)^2$, requires less equalization which results in performance gain over the PR4 read channel. However, a full EPR4 detector requires a significantly more complex add-compare-select (ACS) state machine that operates according to an eight-state trellis.

A recent development in sampled amplitude read channels reaches a compromise between the opposing design criteria of performance versus complexity. This new technique, referred to as remod/demod sequence detection, typically employs: a conventional trellis type maximum likelihood sequence detector, such as a Viterbi detector, for detecting a preliminary binary sequence from the channel sample values; a remodulator for remodulating the detected binary sequence into a sequence of estimated ideal sample values; a sample error generator for subtracting the channel samples from the estimated samples to generate a sample error sequence; an error pattern detector for detecting potential error events in the sample error sequence; and an error corrector for correcting the preliminary binary sequence when an error event exceeds a predetermined threshold. Examples of a remod/demod sequence detector are disclosed in the above referenced co-pending U.S. patent application entitled "A Sampled Amplitude Read Channel Employing Interpolated Timing Recovery and a Remod/Demod Sequence Detector," and in a paper by Roger Wood entitled "Turbo-PRML: A Compromise EPRML Detector," *IEEE Transaction on Magnetics*, Vol. 29, No. 6, pp. 4018, November 1993.

The error pattern detector in a remod/demod sequence detector is typically implemented as a number of finite-impulse-response (FIR) filters matched to the dominant error events of the Viterbi sequence detector. In this manner, when the Viterbi sequence detector makes an error, the probability is high that the error pattern detector will "catch" the error so it can be corrected. A general perception in the prior art is that the error pattern detector should detect the error events in a partial response domain higher in order than the Viterbi sequence detector, which is consistent with the general perception that higher order read channels outperform lower order read channels as described above. For example, in the two aforementioned remod/demod sequence detectors, the Viterbi sequence detector operates in the PR4 domain, while the error pattern detector searches for error events in the EPR4 domain. This particular implementation approaches the performance gain provided by a full eight-state EPR4 Viterbi sequence detector, but with a significant reduction in hardware. The PR4 Viterbi detector can be implemented as a pair of sliding threshold detectors, and the error pattern detector as a bank of FIR filters.

Although the prior art PR4 remod/demod sequence detectors provide a performance gain that approaches that of EPR4 with a significant reduction in hardware, the prior art does not suggest the optimum implementation for an EPR4 remod/demod sequence detector. At best, the prior art would suggest to detect the preliminary binary sequence in the EPR4 domain, and to detect the error events in the EEPR4 domain (which has the transfer function $(1-D)(1+D)^3$). Another drawback of prior art remod/demod sequence detectors is the potential to make miscorrections when an error is falsely detected, or when the location of an error is misdetected. For example, the aforementioned remod/demod sequence detector disclosed by Roger Wood can misdetect an error because it detects the first error event to exceed a predetermined threshold, rather than detecting when the maximum error event occurs. The above-referenced co-pending patent application overcomes this drawback by detecting peaks in the error events; however, a miscorrection can still occur if the error event points to a non-error.

There is, therefore, a need for a remod/demod sequence detector in a sampled amplitude read channel for disk storage systems that provides a performance gain over a conventional EPR4 sequence detector. Another object of the present invention is to modify conventional remod/demod sequence detectors, including the aforementioned prior art PR4 remod/demod sequence detectors, to reduce the probability of miscorrections.

SUMMARY OF THE INVENTION

A sampled amplitude read channel is disclosed for disk storage systems that employs an EPR4 remod/demod sequence detector. To reduce the complexity of timing recovery, gain control and adaptive equalization, the channel samples are initially equalized into a PR4 partial response so that a simple slicer circuit can generate estimated sample values. The PR4 equalized channel samples are then passed through a 1+D filter to generate EPR4 equalized channel samples which are processed by an EPR4 Viterbi sequence detector to generate a preliminary binary sequence. The preliminary binary sequence is remodulated into an estimated or ideal PR4 sample sequence which is subtracted from the PR4 equalized channel samples to generate an error sample sequence. An error pattern detector processes the error sample sequence to detect the dominant error events associated with the EPR4 Viterbi sequence detector. For the data densities of interest (user bit densities of 1.8 to 2.5), the most dominant error event (1,−1 in SNRZI space) is best detected in the EPR4 domain, and the next most dominant error event (1,−2,2,−1 in SNRZI space) is best detected in the PR4 domain. Thus, the error pattern detector comprises a plurality of finite-impulse-response (FIR) filters matched to the dominant error events and, specifically, a first FIR filter matched the error event in EPR4 space, and a second FIR filter matched to the error event in PR4 space. When an error is detected in the preliminary binary sequence (e.g., a peak error event is detected or an error syndrome of an error detection code (EDC) indicates an error), an error corrector corrects the error in the preliminary binary sequence and generates a corrected output sequence. The present invention provides approximately 1 db in gain over a conventional EPR4 Viterbi sequence detector.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Data Format

Figure 1A:
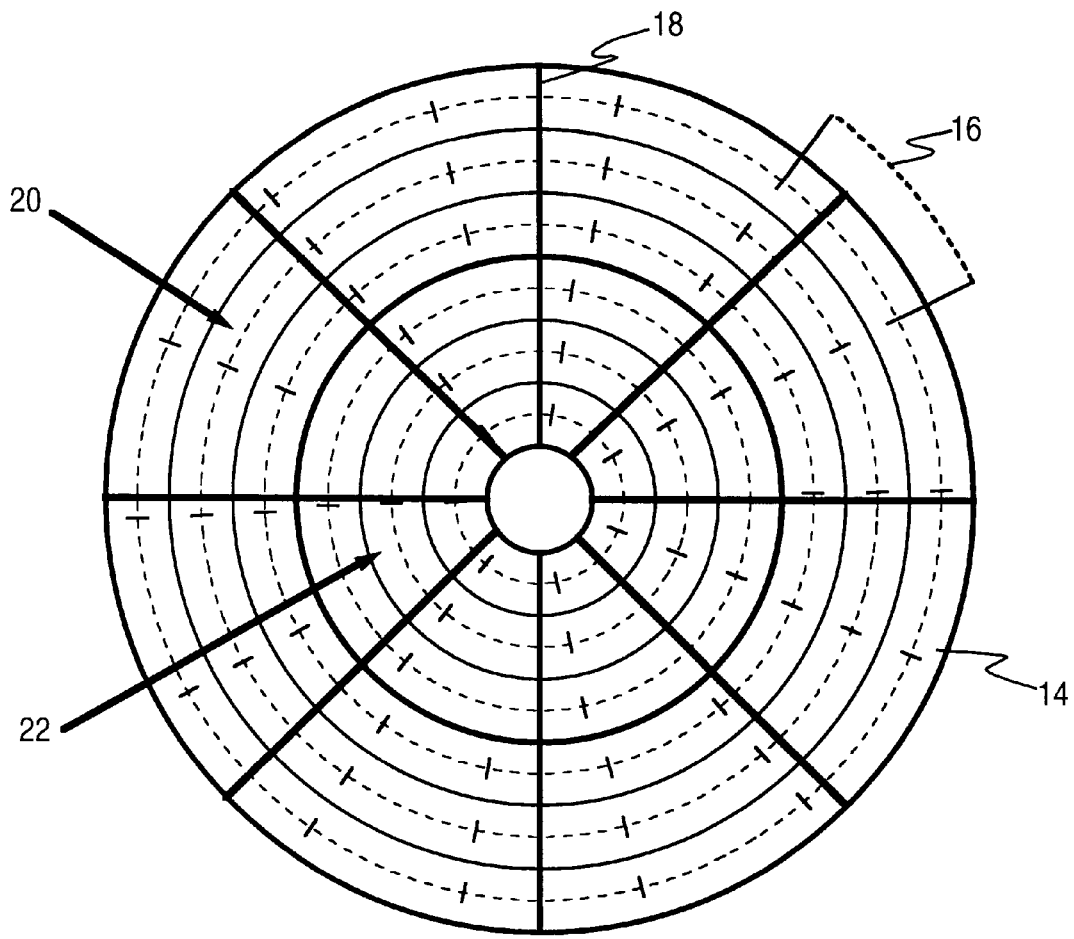
FIG. 1A shows a magnetic disk storage medium comprising a plurality of concentric data tracks and embedded servo wedges, where the data tracks are partitioned into a plurality of data sectors.

FIG. 1A shows a conventional data format of a magnetic disk storage medium comprising a series of concentric, radially spaced data tracks 14, wherein each data track 14 comprises a plurality of sectors 16 with embedded servo wedges 18. A servo controller (not shown) processes the servo data in the servo wedges 18 and, in response thereto, positions a read/write head over a selected track. Additionally, the servo controller processes servo bursts within the servo wedges 18 to keep the head aligned over a centerline of the selected track while writing and reading data. The servo wedges 18 may be detected by a simple discrete-time pulse detector or by the discrete-time sequence detector of FIG. 2. The format of the servo wedges 18 includes a preamble and a sync mark, similar to the user data sectors 16 described below with reference to FIG. 1B.

Zoned recording is a technique known in the art for increasing the storage density by recording the user data at different rates in predefined zones between the inner diameter and outer diameter tracks. The data rate can be increased at the outer diameter tracks due to the increase in circumferential recording area and the decrease in intersymbol interference. This allows more data to be stored in the outer diameter tracks as is illustrated in FIG. 1A where the disk is partitioned into an outer zone 20 comprising fourteen data sectors per track, and an inner zone 22 comprising seven data sectors per track. In practice, the disk may actually be partitioned into several zones at varying data rates.

Figure 1B:
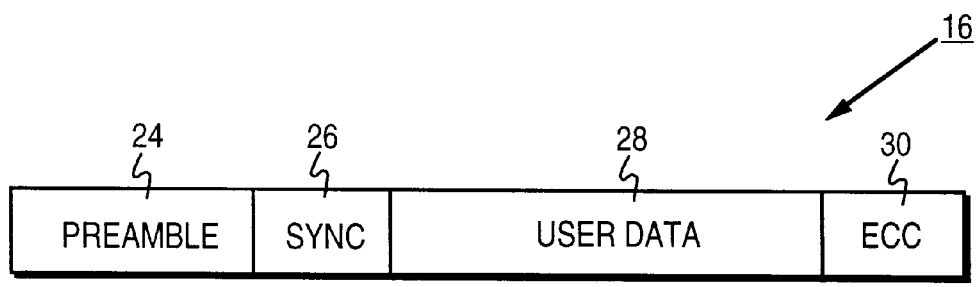
FIG. 1B shows an example format of a data sector comprising a preamble for frequency/phase locking timing recovery, a sync mark for symbol synchronizing the user data, and redundancy symbols of an error correction code (ECC).

FIG. 1B shows the format of a conventional data sector 16 comprised of an acquisition preamble 24, a sync mark 26, and a data field 28 including appended ECC bytes 30 for use in detecting and correcting errors in the user data upon readback. Timing recovery 68 of FIG. 2 processes the acquisition preamble 24 to acquire the correct data frequency and phase before reading the user data field 28, and the sync mark 26 demarks the beginning of the user data field 28 for use in symbol synchronizing the user data.

Sampled Amplitude Read Channel

Figure 2:
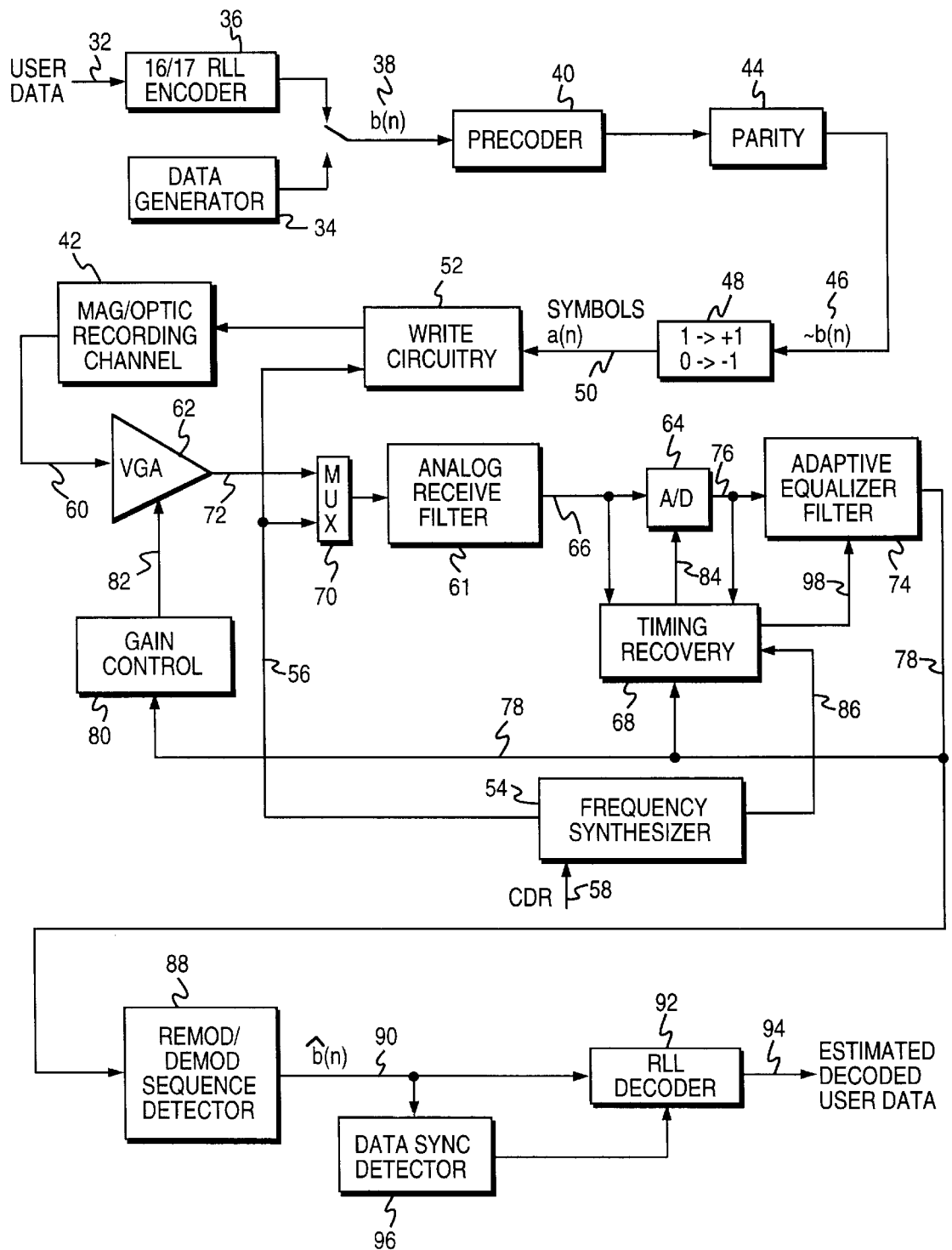
FIG. 2 is a block diagram of a sampled amplitude read channel comprising the remod/demod sequence detector of the present invention.

Referring now to FIG. 2, shown is a block diagram of the sampled amplitude read channel of the present invention. During a write operation, the read channel receives user data over line 32 from the host system. A data generator 34 generates the preamble 24 of FIG. 1B (for example 2T preamble data) written to the disk prior to writing the user data 28. The data generator 34 also generates a sync mark 26 for use in symbol synchronizing to the user data during a read operation. A 16/17 RLL encoder 36 encodes the user data according to a run-length limited RLL (d,k) constraint to generate an encoded binary sequence b(n) 38. The preferred embodiment for the 16/17 RLL encoder 16 is disclosed in the above referenced co-pending U.S. patent application "A Rate 16/17 ENDEC With Independent High/Low Byte Decoding." A precoder 40 precodes the binary sequence b(n) 38 in order to compensate for the transfer function of the recording channel 42 and equalizing filters. A parity generator 44 computes the parity over a section or block of bits output by the precoder 40 and appends a parity bit to each block to form EDC code words. The sequence of bits ~b(n) 46 in the EDC code words are converted into symbols a(n) 50 by translating 48 ~b(N)=0 into a(N)=−1, and ~b(N)=1 into a(N)=+1 (the symbols ~b(n) 46 are referred to as NRZ data). Write circuitry 52, responsive to the symbols a(n) 50, modulates the current in the recording head coil (or intensity of a laser beam) at the zone baud rate to record a sequence of transitions onto the disk 42, wherein the transitions represent the recorded data. A frequency synthesizer 54 provides a baud rate write clock 56 to the write circuitry 52 and is adjusted by a baud or channel data rate signal (CDR) 58 according to the current zone the recording head is over.

When reading the recorded binary sequence from the media, timing recovery 68 first locks to the write frequency by selecting, as the input to the read channel, the write clock 56 through a multiplexer 70. Once locked to the write frequency, the multiplexer 70 selects the signal 72 from the read head as the input to the read channel in order to acquire the acquisition preamble 24 recorded on the disc prior to the recorded user data 28 as shown in FIG. 1B. A variable gain amplifier 62 adjusts the amplitude of the analog read signal 60, and an analog receive filter 61 provides initial equalization toward the desired response as well as attenuating aliasing noise. A sampling device 64 samples the analog read signal 66 from the analog filter 61, and a discrete-time equalizer filter 74 provides further equalization of the sample values 76 toward the desired response. In partial response recording, for example, the desired partial response is often selected from Table 1:

TABLE 1

| Channel | Transfer Function | Dipulse Response |
| --- | --- | --- |
| PR4 | (1 − D) (1 + D) | 0, 1, 0, −1, 0, 0, 0, . . . |
| EPR4 | (1 − D) (1 + D)$^2$ | 0, 1, 1, −1, −1, 0, 0, . . . |
| EEPR4 | (1 − D) (1 + D)$^3$ | 0, 1, 2, 0, −2, −1, 0, . . . |

The discrete equalizer filter 74 may be implemented as a real-time adaptive filter which compensates for parameter variations over the disc radius (i.e., zones), disc angle, and environmental conditions such as temperature drift.

After equalization, the equalized sample values 78 are applied to a decision directed gain control 80 and timing recovery 68 circuit for adjusting the amplitude of the read signal 60 and the frequency and phase of the sampling device 64, respectively. Gain control 80 adjusts the gain of variable gain amplifier 62 over line 82 in order to match the magnitude of the channel's frequency response to the desired partial response, and timing recovery 68 adjusts the frequency of sampling device 64 over line 84 in order to synchronize the equalized samples 78 to the baud rate. Frequency synthesizer 54 provides a course center frequency setting to the timing recovery circuit 68 over line 86 in order to center the timing recovery frequency over temperature, voltage, and process variations.

In the preferred embodiment, the discrete-time equalizer 74 equalizes the 76 sample values into a PR4 response so that a simple slicer circuit (not shown) can generate estimated sample values for use in timing recovery 68 and gain control 80. A slicer generates estimated sample values simply by comparing the channel samples to programmable positive and negative thresholds according to Table 2:

TABLE 2

| Sample Value | Slicer Output |
| --- | --- |
| y >= T1 | +1 |
| −T2 <= y < T1 | 0 |
| y < −T2 | −1 |

In Table 2, y is the sample value and T1 and −T2 are the positive and negative thresholds, respectively. If the discrete-time equalizer 74 is real time adaptive, then the estimated sample values generated by the slicer are also input into the equalizer 74 over line 98 for use in the adaptive equalization algorithm. For implementation details concerning sample value estimation for timing recovery 68 and gain control 80, see the above referenced U.S. Pat. No. 5,585,975, "Equalization for Sample Value Estimation and Sequence Detection in a Sampled Amplitude Read Channel." For details on the preferred embodiment for an adaptive discrete-time equalizer, see the above referenced co-pending U.S. patent application, "Adaptive Equalization and Interpolated Timing Recovery in a Sampled Amplitude Read Channel for Magnetic Recording." The aforementioned co-pending U.S. patent application also illustrates an alternative embodiment for synchronous-sampling timing recovery 68: sampling the analog read signal asynchronously and interpolating the asynchronous samples to generate the synchronous samples.

The synchronous, equalized samples 78 are ultimately input into a remod/demod sequence detector 88 which detects an estimated binary sequence ôb(n) 90 from the sample values. An RLL decoder 92 decodes the estimated binary sequence ôb(n) 90 from the sequence detector 88 into estimated user data 94. A data sync detector 96 detects the sync mark 26 (shown in FIG. 1B) in the data sector 16 in order to frame operation of the RLL decoder 92. In the absence of errors, the estimated binary sequence ôb(n) 90 matches the recorded binary sequence b(n) 38, and the decoded user data 94 matches the recorded user data 32. A detailed description of the remod/demod sequence detector 88 is provided in the following section.

Trellis Sequence Detector

The sampled amplitude read channel of the present invention employs partial response (PR) equalization and maximum likelihood (ML) sequence detection (e.g., Viterbi sequence detection). To understand the sequence detection operation, consider the trellis sequence detector for a partial response class-IV (PR4) read channel. The transfer function for this channel is represented by the polynomial $(1-D^2)$ where D is a delay operator referring to the channel or baud rate. With the input symbols a(n) taking on the values +1 or −1, the output channel samples take on values in the set {+2,0,−2}. A trellis sequence detector, such as a Viterbi detector for PR4, operates by examining the channel samples in context to determine a most likely estimated data sequence associated with the samples.

Figure 3A:
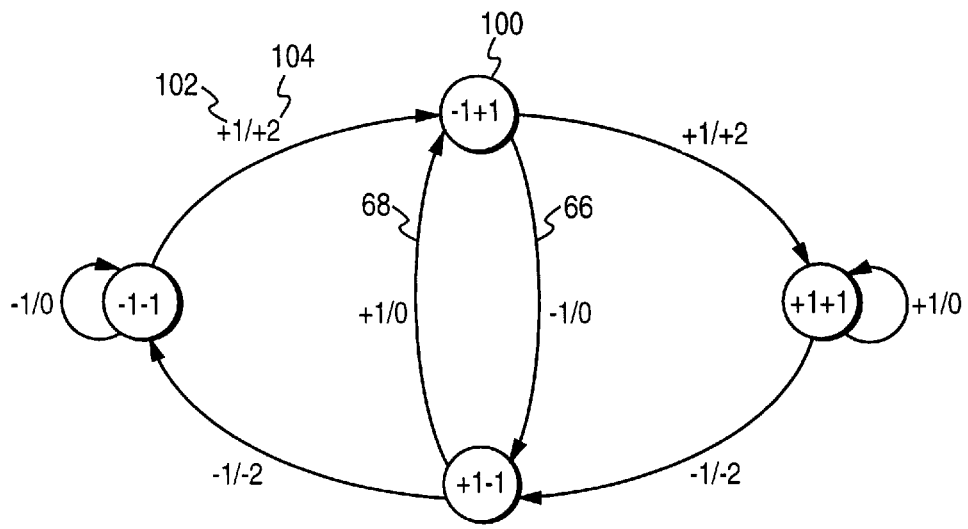
FIG. 3A is a state transition diagram of a conventional Partial Response class-IV (PR4) Viterbi sequence detector.

Operation of the PR4 sequence detector is understood from its state transition diagram shown in FIG. 3A. Each state 100 is represented by the last two input symbols a(n) 102 (after preceding), and each branch from one state to another is labeled with the current input symbol a(n) 102 and the corresponding sample value 104 it will produce during readback. Thus, during readback the sample sequence can be demodulated into the input symbol sequence a(n) (recorded sequence) according to the state transition diagram. However, noise in the read signal due to timing errors, miss-equalization, etc., will obfuscate the readback sample values and introduce ambiguity in the correct demodulated data sequence. The function of the sequence detector, then, is to resolve this ambiguity by demodulating the sample values into a most likely data sequence.

Figure 3B:
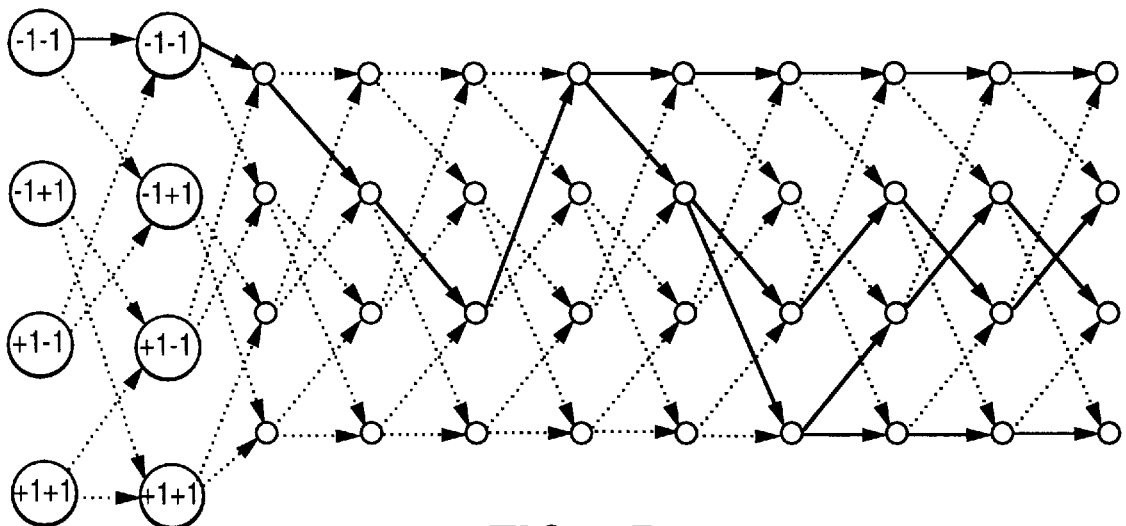
FIG. 3B is a PR4 trellis diagram corresponding to the PR4 state transition diagram of FIG. 3A.

The demodulation process of the sequence detector is understood by representing the state transition diagram of FIG. 3A as a trellis diagram shown in FIG. 3B. The trellis diagram represents a time sequence of sample values and the possible recorded input sequences a(n) that could have produced the sample sequence. For each possible input sequence a(n), an error metric is computed relative to a difference between the sequence of expected sample values that would have been generated in a noiseless system and the actual sample values read from the channel. For instance, a Euclidean metric is computed as the accumulated square difference between the expected and actual sample values. The input sequence a(n) that generates the smallest Euclidean metric is the most likely sequence to have created the actual sample values; this sequence is therefore selected as the output of the sequence detector.

To facilitate the demodulation process, the sequence detector comprises path memories for storing each of the possible input sequences a(n) and a corresponding metric. A well known property of the sequence detector is that the paths storing the possible input sequences will "merge" into a most likely input sequence after a certain number of sample values are processed (as long as the input sequence is appropriately constrained). In fact, the maximum number of path memories needed equals the number of states in the trellis diagram; the most likely input sequence will always be represented by one of these paths, and these paths will eventually merge into one path (i.e., the most likely input sequence) after a certain number of sample values are processed.

The "merging" of path memories is understood from the trellis diagram of FIG. 3B where the "survivor" sequences are represented as solid lines. Notice that each state in the trellis diagram can be reached from one of two states; that is, there are two transition branches leading to each state. With each new sample value, the Viterbi algorithm recursively computes a new error metric and retains a single survivor sequence for each state corresponding to the minimum error metric. In other words, the Viterbi algorithm will select one of the two input branches into each state since only one of the branches will correspond to the minimum error metric. As a result, the paths through the trellis corresponding to the branches not selected will merge into the paths that were selected. Eventually, all of the survivor sequences will merge into one path through the trellis which represents the most likely estimated data sequence to have generated the sample values as shown in FIG. 3B.

Figure 4A:
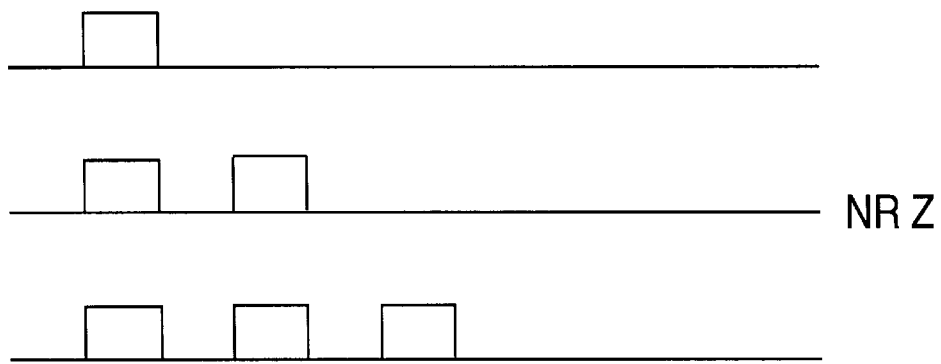
FIGS. 4A, 4B and 4C show the dominant minimum distance error events of a PR4 sequence detector in NRZ, PR4 and EPR4 space, respectively.
Figure 4B:
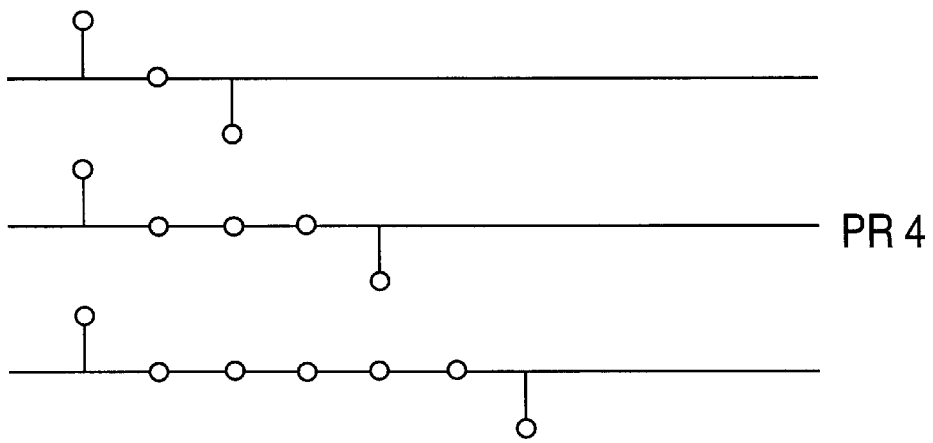
Figure 4C:
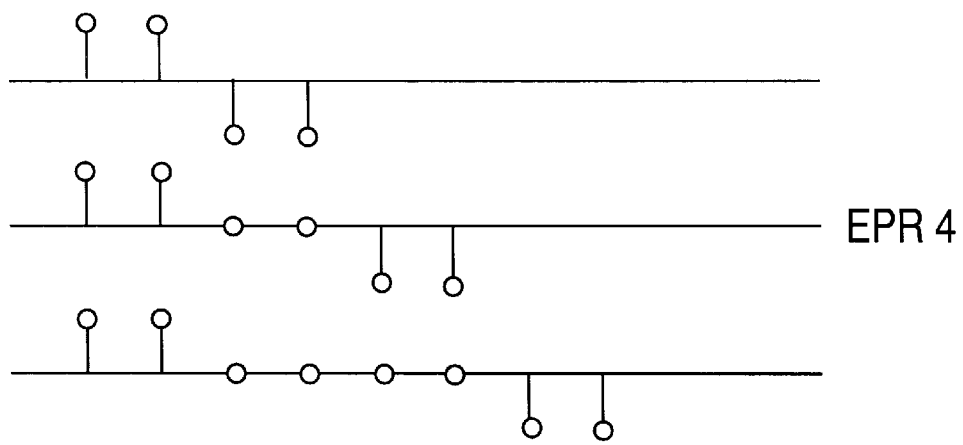

Although trellis sequence detection is "maximum likelihood" (or an approximation thereof depending on how the equalizers color the noise), the sequence detector can still make an error in detecting the output sequence if enough destructive noise is present in the read signal. FIGS. 4A–4C illustrate the sample error sequences associated with the dominant minimum distance error events in NRZ, PR4 and EPR4 domains, respectfully. In general, a higher order sequence detector will outperform a lower order sequence detector due to the number of samples the error event affects. Consider, for example, the first error event in the NRZ domain shown in FIG. 4A. This error event corrupts two samples (two output bits) in the PR4 domain of FIG. 4B and four samples in the EPR4 domain of FIG. 4C. Thus, "spreading out" the error event reduces the probability of a detection error. From this observation, it has been determined that the sample errors can be evaluated in a higher order domain to determine when a lower order sequence detector will make an error. This is the essential function of a conventional remod/demod sequence detector: detect a preliminary binary sequence with a lower order trellis sequence detector (e.g., with PR4 Viterbi detector), and evaluate the sample errors in a higher order domain (e.g., in EPR4 domain) to determine when the PR4 Viterbi detector has most likely made an error.

The generalization that the sample errors will provide more information if evaluated in a higher order domain, however, is only true for certain error events depending on the channel density employed. As discussed in more detail below, the applicant's have discovered that for certain error events and at certain user densities, it is better to evaluate the sample errors in a lower order domain (e.g., PR4 as opposed to EPR4). Another drawback of conventional remod/demod sequence detectors is the potential of miscorrections. That is, a conventional remod/demod sequence detector can determine only when the primary Viterbi sequence detector has probably made an error without means for verifying that an error actually occurred. The present invention provides a performance enhancement by reducing the likelihood of a miscorrection through the use of an error detection code (EDC). This aspect of the present invention is discussed in the following section.

Remod/Demod Sequence Detector

Figure 5:
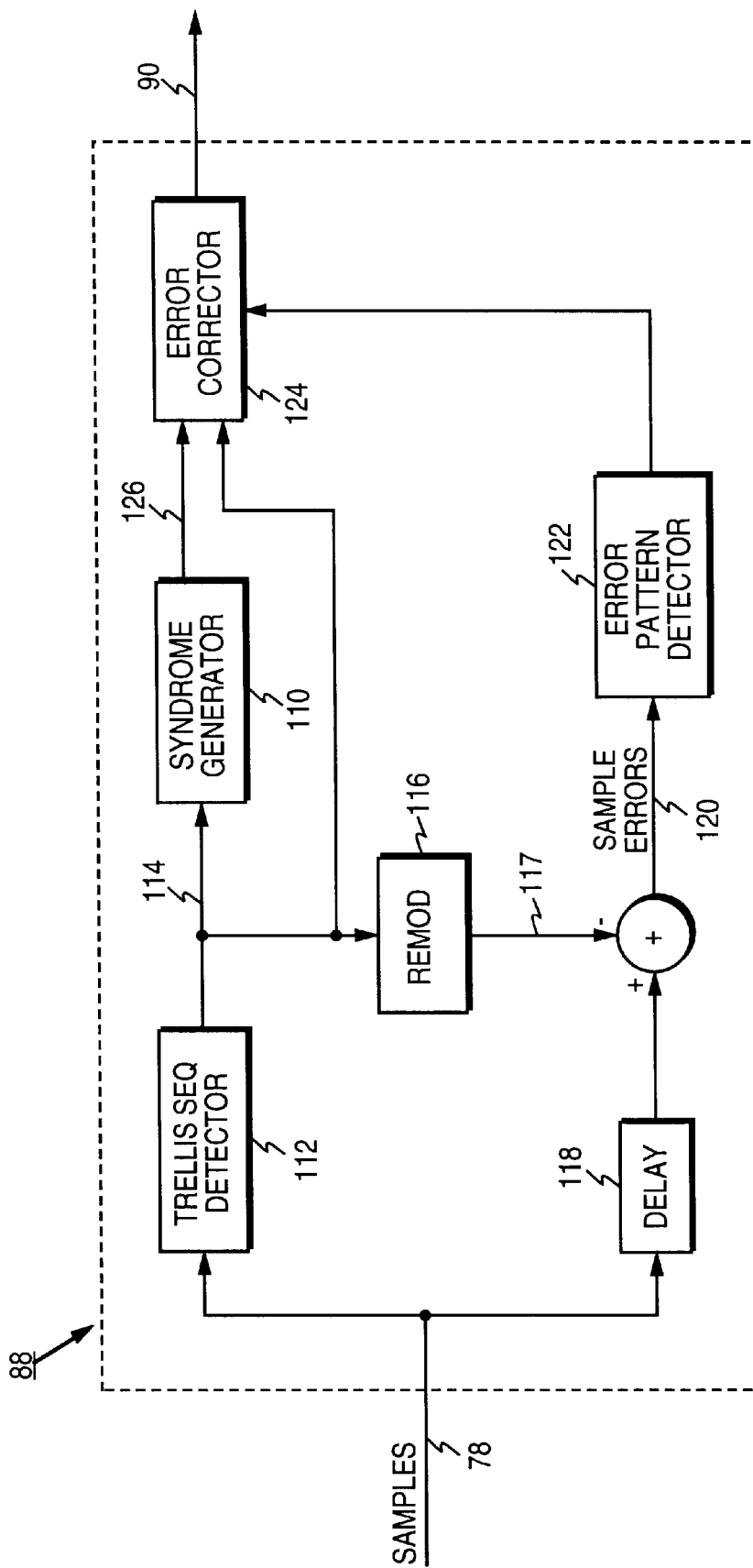
FIG. 5 is a detailed block diagram of the remod/demod sequence detector of FIG. 2 showing one aspect of the present invention: a syndrome generator for detecting when an error occurs in the preliminary binary sequence output by the Viterbi sequence detector.

FIG. 5 shows a block diagram of the remod/demod sequence detector 88 of FIG. 2 guided by a syndrome generator 110 according to one aspect of the present invention. Guiding the detector using an error syndrome is applicable to a conventional remod/demod sequence detector, such as the aforementioned PR4 remod/demod sequence detectors, or it can be applied to the EPR4 remod/demod sequence detector described in the next section. The general operation of a remod/demod sequence detector is as follows.

The equalized samples 78 output by the discrete equalizer 74 of FIG. 2 are processed by a conventional trellis sequence detector 112, such as a Viterbi sequence detector, to detect a preliminary binary sequence 114. A remodulator 116 remodulates the preliminary binary sequence 114 into an estimated sequence of ideal sample values 117 which are subtracted from the channel samples 78 (after passing through a delay 118 to account for the delay in the trellis detector 112) to generate a sequence of sample error values 120. An error pattern detector 122 processes the sequence of sample errors 120 to detect when the trellis detector 112 most likely made an error. The error pattern detector 122 typically comprises a plurality of finite-impulse-response (FIR) filters matched to the dominant error events of the trellis detector 112 (e.g., FIG. 4). In prior remod/demod sequence detectors, an error in the preliminary binary sequence 114 is corrected by an error corrector 124 when the output of an FIR filter matched to a particular error event exceeds a predetermined threshold and the detected binary sequence 114 is consistent with the detected error event. However, the preliminary binary sequence can be miscorrected if the error event actually points to a non-error in the detected binary sequence.

To decrease the probability of miscorrections, the present invention employs an error detection code (EDC) capable of detecting when an error occurs in a predetermined number of bits (i.e., a block) of the detected binary sequence. In the preferred embodiment, the EDC is simply generated as the parity over four of the 17-bit code words generated by the 16/17 RLL encoder 36 of FIG. 2 after preceding 40 (i.e., parity over the bits in the NRZ domain). The parity bit output by the parity generator 44 is then appended to the four 17-bit code words to create a 69-bit EDC code word written to the disk 42. Upon read back, the syndrome generator 110 of FIG. 5 processes the detected binary sequence output by the trellis sequence detector 112 to generate an error syndrome 126 (e.g., parity) which indicates whether an error occurred in the EDC code word (i.e., the 69-bit EDC code word).

When the error syndrome 126 indicates that the EDC code word contains an error, the error corrector 124 corrects the preliminary binary sequence 114 using the error event detected by the error pattern detector 122 most likely to have caused the error (e.g., the maximum error event). In this manner, the probability of a miscorrection decreases because the error syndrome of the EDC only allows a correction to occur when an error is present. A miscorrection can still occur if the selected error event used to make the correction is the wrong error event—nevertheless, it is still an improvement over the prior art.

An error that occurs in a current EDC code word may propagate over the code word boundaries to the previous or following EDC code words. Circuity is provided in the error pattern detector 122 to account for this possibility—an example embodiment for this circuitry is discussed in greater detail below with reference to FIGS. 9, 10, 11A, and 11B, and with reference to FIG. 6 which shows the preferred embodiment for the EPR4 remod/demod sequence detector of the present invention.

Those skilled in the art will appreciate that the present invention could be modified to operate with an error detection code other than parity. Furthermore, the syndrome guiding aspect of the present invention is applicable to the aforementioned conventional remod/demod sequence detectors, as well as to more advanced detectors such as the EPR4 remod/demod detector described in the following section.

EPR4 Remod/Demod Sequence Detector

Figure 6:
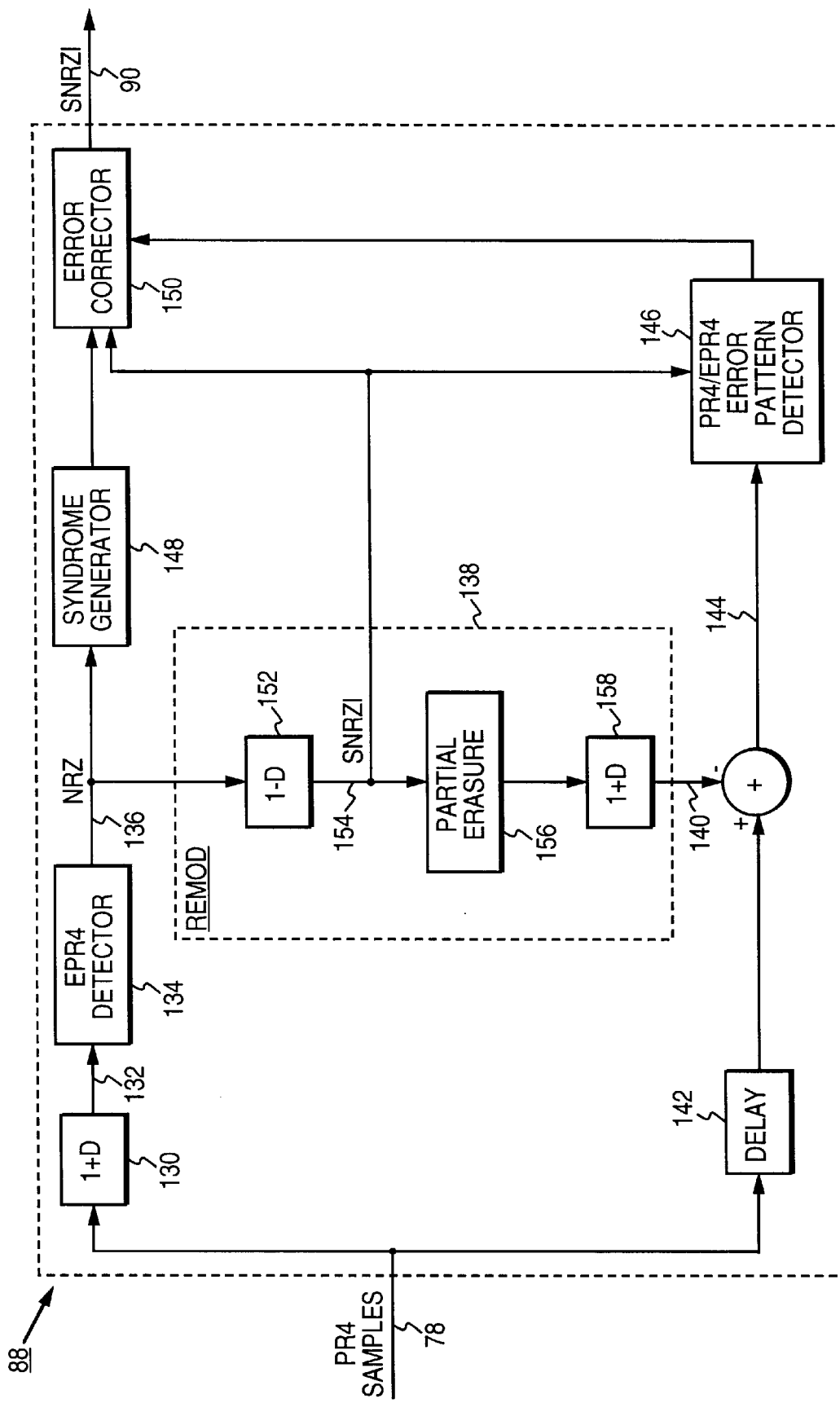
FIG. 6 is a detailed block diagram of the remod/demod sequence detector showing another aspect of the present invention: PR4 equalized channel samples, an EPR4 Viterbi sequence detector, and a PR4/EPR4 error pattern detector.

In another aspect of the present invention, a conventional EPR4 sequence detector is enhanced by applying the remod/demod technique in a manner not suggested by the prior art. The preferred embodiment for this sequence detector is shown in FIG. 6. As discussed above with reference to FIG. 2, the channel samples 78 are equalized into a PR4 response so that a simple slicer circuit can generate the estimated sample values for use by timing recovery 68, gain control 80, and the adaptive equalizer 74. The PR4 samples 78 are converted to EPR4 samples 132 by a simple 1+D filter 130 shown in FIG. 6. An EPR4 sequence detector 134 detects a preliminary NRZ sequence 136 from the EPR4 samples, and the NRZ sequence is then remodulated by remodulator 138 to generate a sequence of estimated sample values 140 similar to FIG. 5. The estimated sample values 140 are subtracted from the PR4 channel samples (after passing through a delay 142 to account for the delay in the EPR4 detector 134) to 11 generate a sequence of sample error values 144. A PR4/EPR4 error pattern detector 146 processes the sample error values 144 and saves the correction value and location of the most likely error event. A syndrome generator 148 generates an error syndrome (e.g., parity) over a block of the NRZ sequence 136 and, if the error syndrome indicates that the EPR4 detector 134 made a detection error, a signed NRZI sequence 154 (generated by the remodulator 138) is corrected by an error corrector 150 using the most likely error event generated by the error pattern detector 146.

Figure 7:
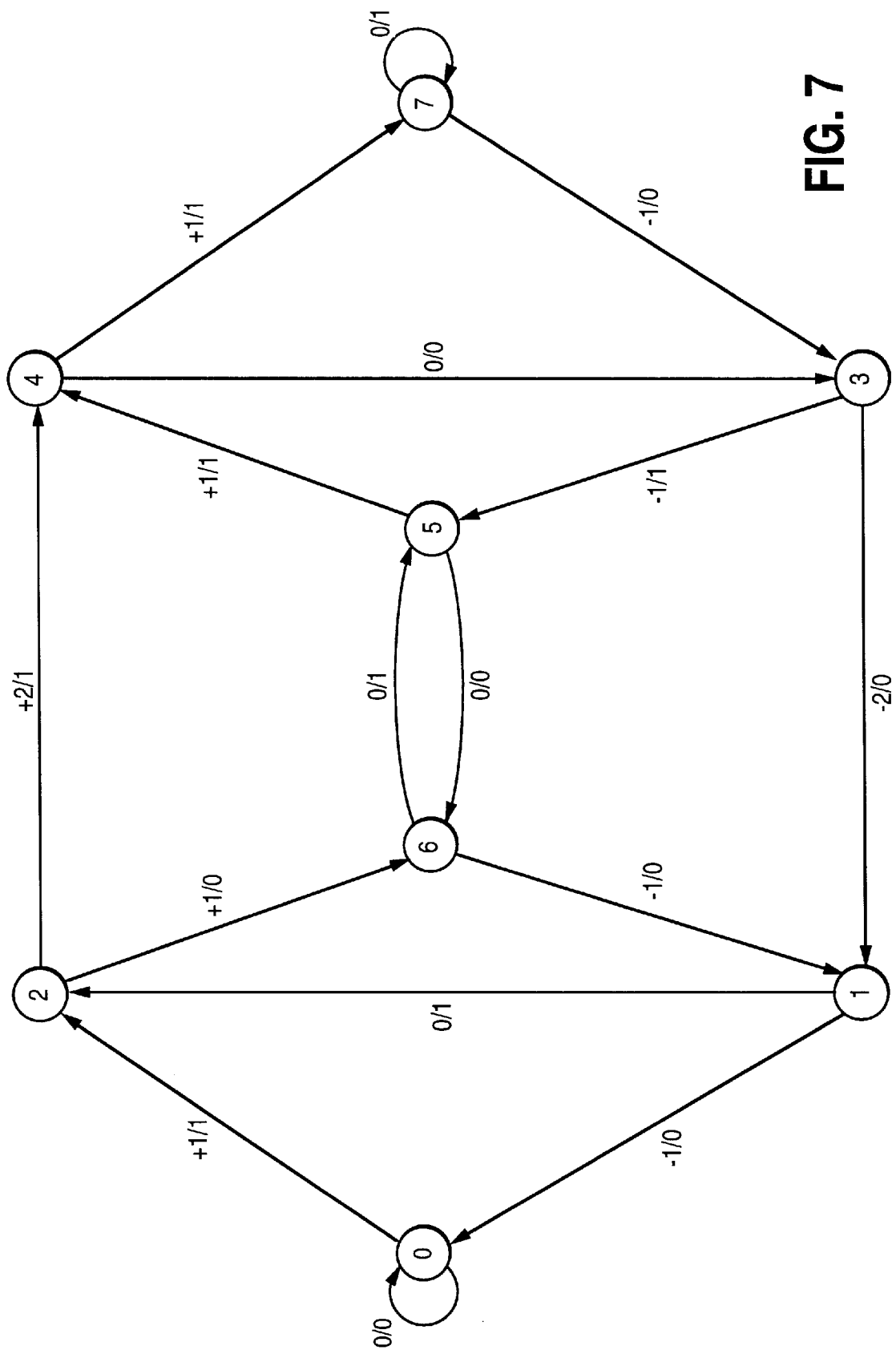
FIG. 7 shows the state transition diagram of the EPR4 Viterbi sequence detector of FIG. 6.

The EPR4 sequence detector 134 of FIG. 6 operates according to the state transition diagram shown in FIG. 7, which is similar to the state transition diagram of FIG. 3A described above with reference to a PR4 read channel. The transfer function of an EPR4 read channel is:

$$1+D-D^2-D^3.$$

The channel output is defined as the convolution of the input symbols a(n) 50 of FIG. 2 with the dipulse response of the above EPR4 transfer function (+1, +1, −1, −1). Therefore, the current output of the EPR4 read channel is determined from the current and three previous input symbols a(n). Each state in the state transition diagram of FIG. 7 represents one of eight possible values for the three previous input symbols a (n), and each transition branch is labeled with an x/y where x is the current input symbol a(n) and y is the corresponding channel output it will generate in the NRZ domain. The channel output y represents the output detected by the EPR4 sequence detector; it is in the NRZ domain because the parity bit is generated in the NRZ domain (i.e., by the parity generator 44 of FIG. 2).

Figure 8:
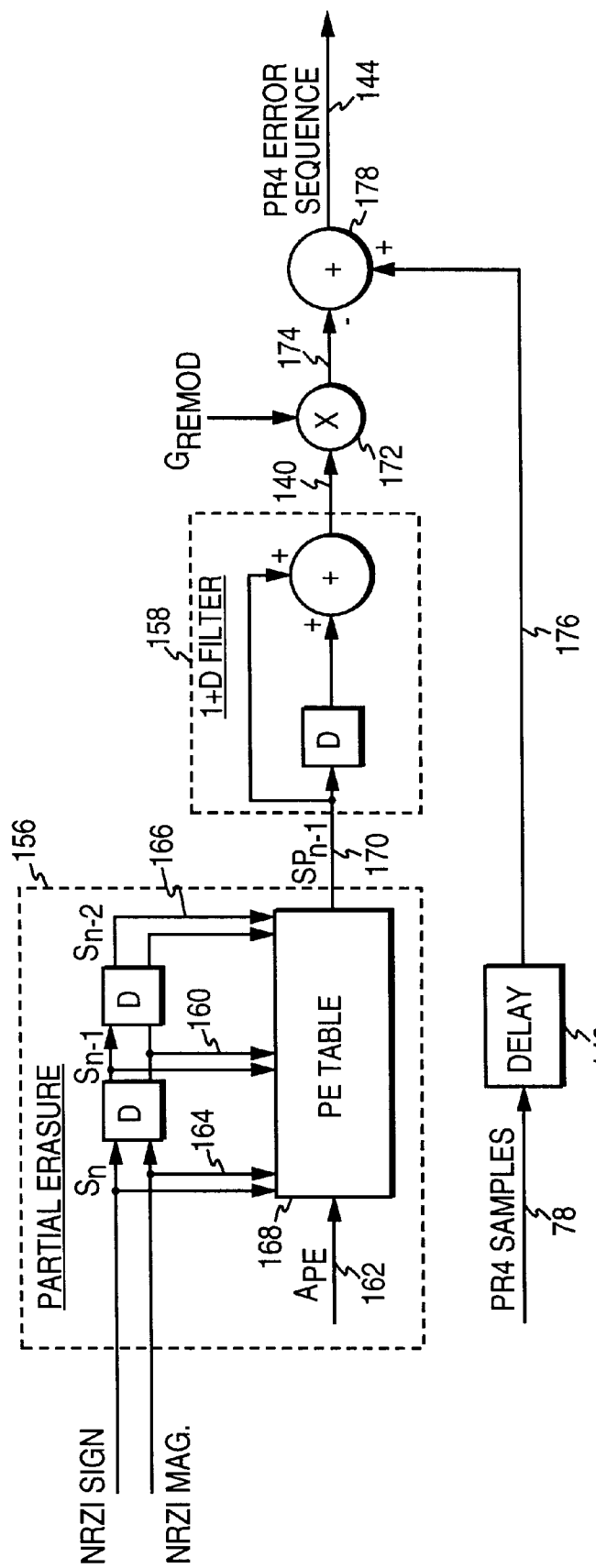
FIG. 8 is a more detailed block diagram of the remodulator of the present invention.

The remodulator 138 of FIG. 6 comprises a 1−D filter 152 for converting the NRZ sequence 136 into a signed NRZI (SNRZI) sequence 154, a partial erasure compensator 156 which adjusts the magnitude of the SNRZI sequence 154 to account for the effect of partial erasure, and a 1+D filter 158 for converting the output of the partial erasure compensator 156 into a sequence of estimated PR4 sample values 140. A more detailed block diagram of the remodulator 138 of FIG. 6 is shown in FIG. 8.

The partial erasure compensator 156 adjusts the magnitude of the SNRZI samples to account for the non-linear reduction in pulse amplitude caused by adjacent flux transitions. That is, the magnitude of the SNRZI sample at $S_{n-1}$ 160 is reduced by $A_{PE}$ 162 (where $A_{PE}<1$) if there is an adjacent transition either at $S_n$ 164 or at $S_{n-2}$ 166, and the magnitude of $S_{n-1}$ 160 is reduced by $(A_{PE}+A_{PE})$ if there is an adjacent transition both at $S_n$ 164 and at $S_{n-2}$ 166. To implement the partial erasure compensator 156, the SNRZI samples, designated $S_n$, $S_{n-1}$ and $S_{n-2}$, index a lookup table 168 which outputs a modified value for $S_{n-1}$ (designated $SP_{n-1}$ 170) in accordance with the entries shown in Table 3.

TABLE 3

| SNRZI | | | MODIFIED SNRZI | SNRZI | | | MODIFIED SNRZI |
|---|---|---|---|---|---|---|---|
| $S_{n-2}$ | $S_{n-1}$ | $S_n$ | $SP_{n-1}$ | $S_{n-2}$ | $S_{n-1}$ | $S_n$ | $SP_{n-1}$ |
| 0 | +1 | 0 | +1 | 0 | −1 | 0 | −1 |
| −1 | +1 | 0 | +1 − $A_{PE}$ | +1 | −1 | 0 | −1 + $A_{PE}$ |
| 0 | +1 | −1 | +1 − $A_{PE}$ | 0 | −1 | +1 | −1 + $A_{PE}$ |
| −1 | +1 | −1 | +1 − ($A_{PE}$ + $A_{PE}$) | +1 | −1 | +1 | −1 + ($A_{PE}$ + $A_{PE}$) |

After compensating for the effect of partial erasure, the modified SNRZI samples $SP_{n-1}$ 170 pass through a 1+D filter 158, thereby converting the SNRZI samples into an estimated PR4 sample sequence 140. Because the gain control 80 of FIG. 2 attempts to compensate for the non-linear effect of partial erasure by adjusting the read signal amplitude toward an ideal PR4 magnitude on average, a gain multiplier 172 adjusts the magnitude of the remodulated PR4 sequence 140 to compensate for this adjustment. The estimated PR4 sample sequence 174 at the output of the gain multiplier 172 is then subtracted from the actual read signal sample values 176 at adder 178 to generate a PR4 sample error sequence 144.

Figure 9:
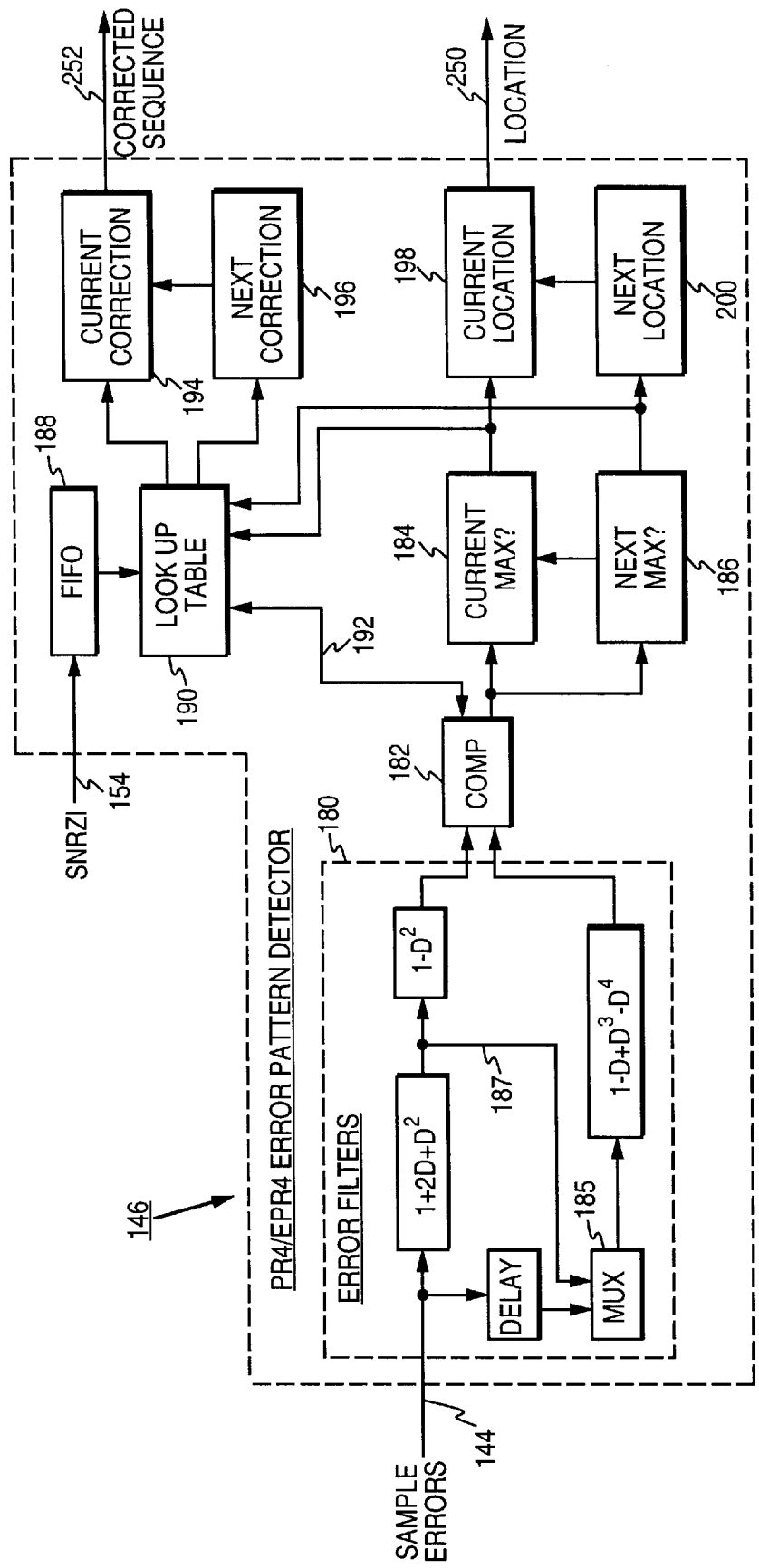
FIG. 9 is a block diagram of the error pattern detector in the remod/demod sequence detector of the present invention.

The sample error sequence 144 is then processed by the PR4/ERP4 error pattern detector 146 of FIG. 6, a more detailed diagram of which is provided in FIG. 9. Through computer simulations it was determined that, for user densities of 1.8 to 2.5, the most dominant error event (the SNRZI (+1, −1) error event) is best detected in the EPR4 domain, while the next most dominant error event (the SNRZI (+1, −2, +2, −1) error event) is best detected in the PR4 domain. Therefore, the PR4/EPR4 error pattern detector 146 of the present invention comprises two FIR filters 180 of the form:

$$(1+2D+D^2)(1-D^2)$$

and $$1-D+D^3-D^4.$$

The first FIR filter is matched to the SNRZI (+1,−1) minimum distance error event in the EPR4 domain, and the second FIR filter is matched to the SNRZI (+1, −2, +2, −1) minimum distance error event in the PR4 domain.

To allow for further flexibility, a multiplexer 185 is provided to selectively configure the second error FIR error filter to detect the error event in the EPR4 domain rather than in the PR4 domain. That is, the multiplexer 185 can select the intermediate output 187 from the first FIR filter in order to configure the second FIR filter into the form:

$$(1+2D+D^2)(1-D+D^3-D^4)$$

which is matched to the SNRZI (+1, −2, +2, −1) minimum distance error event in the EPR4 domain. Detecting both error events in the EPR4 domain may be desirable depending on the system dynamics and/or the recording density employed.

For each error sample input into the error pattern detector, a comparator 182 selects the FIR filter with the largest absolute magnitude output that corresponds to a valid error sequence as described below. The output of the comparator 182 is then compared to a "current maximum" at comparator 184 and to a next maximum at comparator 186. The "current maximum" saves the maximum FIR output for the current EDC code word being processed, and the "next maximum" saves the maximum FIR output for the following EDC code word.

The SNRZI sequence 154 generated by the remodulator 138 is buffered in a FIFO buffer 188 and compared to expected error sequences stored in a lookup table 190. As each new sample value is processed, the output of the error filters 180 index the lookup table 190 over line 192 to determine whether the detected SNRZI sequence 154 matches a valid error sequence. The comparator 182 will only compare the output of the error filters 180 with corresponding valid error sequences (the output of error filters corresponding to invalid error sequences are set to zero). When a potential error event is detected because the maximum valid FIR output 180 exceeds the current maximum or the next maximum at comparator 184 or 186, the lookup table 190 outputs a correction sequence corresponding to the detected error for the current and/or next EDC code word, and the correction sequences are saved in registers 194 and 196, respectively.

The lookup table 190 of FIG. 9 operates according to Table 4 and Table 5 below which show the expected SNRZI sequences resulting from the two detected error events, E1 and E2, and the corresponding corrected output sequences.

TABLE 4

SNRZI Error (+1,−1)

| | Expected SNRZI | | Corrected SNRZI | | | Expected SNRZI | | Corrected SNRZI | |
|---|---|---|---|---|---|---|---|---|---|
| E1 | $S_n$ | $S_{n-1}$ | $S_n$ | $S_{n-1}$ | E1 | $S_n$ | $S_{n-1}$ | $S_n$ | $S_{n-1}$ |
| E1 < 0 | +1 | −1 | +0 | +0 | E1 > 0 | −1 | +1 | −0 | −0 |
| E1 < 0 | −0 | −1 | −1 | +0 | E1 > 0 | +0 | +1 | +1 | −0 |
| E1 < 0 | +1 | −0 | +0 | +1 | E1 > 0 | −1 | +0 | −0 | −1 |
| E1 < 0 | −0 | −0 | −1 | +1 | E1 > 0 | +0 | +0 | +1 | −1 |

The outputs of comparators 184 and 186 enable operation of the lookup table 190 as well as indicate the location of the error event in the SNRZI sequence 154 for the current and next EDC code words. The location of the errors are stored in registers 198 and 200, respectively. When the parity syndrome generated by the parity generator 148 of FIG. 6 indicates a detection error in the current EDC code word, the error corrector 150 corrects the SNRZI sequence 154 using the corrected sequence stored in register 194 and the corresponding location of the error stored in register 198.

The reason for storing the maximum FIR output and corresponding correction sequence and error location for the next EDC code word is because an error in the current EDC code word can propagate over the code word boundaries to the previous or next EDC code word. Therefore, the error pattern detector 146 searches for error events starting with the last two bits of the previous EDC code word and extending through the first three bits of the next EDC code word. This aspect of the present invention is better understood with reference to FIG. 10 which is a flow diagram executed when processing a data sector, and FIG. 11A and 11B which illustrate both the parity generation and maximum error event detection, including the case where an error extends over the EDC code word boundaries.

Figure 10:
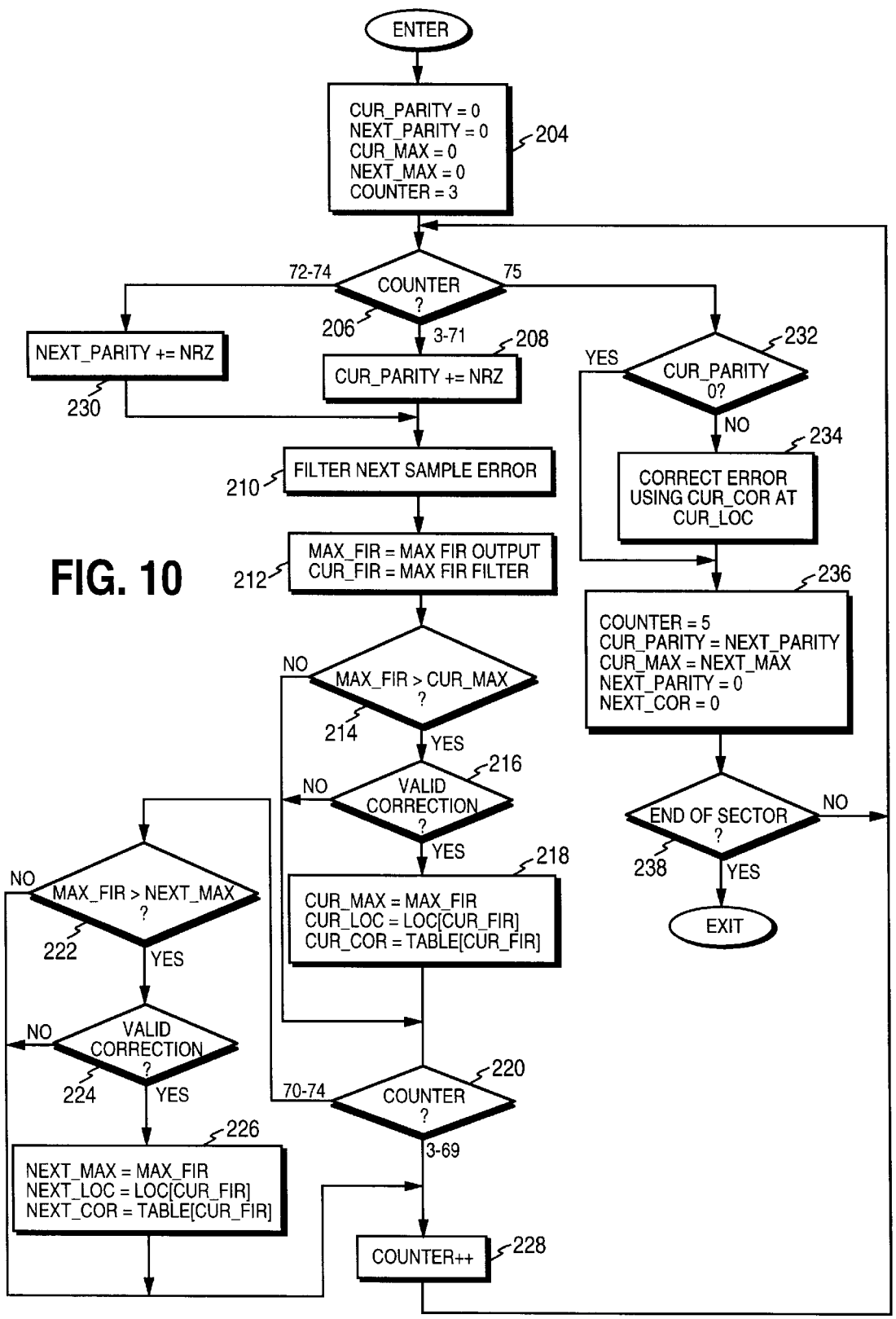
FIG. 10 is a flow chart that illustrates the operation of the syndrome generation (parity) and error correction process according to one aspect of the present invention.
Figure 11A:
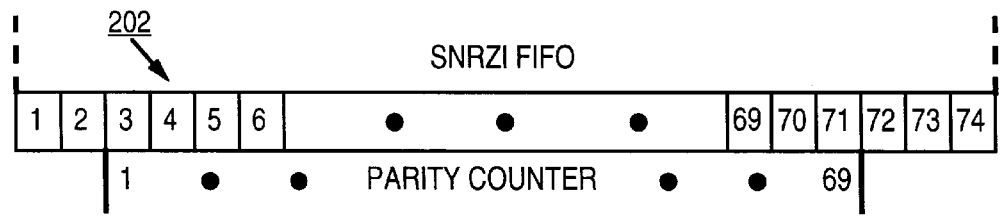
FIGS. 11A and 11B illustrate the syndrome generation (parity) when an error event occurs across code word boundaries.

FIG. 11A shows 74 bits of a current sector buffered in a FIFO buffer 202, including the last two bits of a previous EDC code word, 69 bits of a current EDC code word, and the first three bits of the next EDC code word. The data stored in the FIFO buffer 202 is processed according to the flow diagram of FIG. 10, wherein at step 204 the current parity CUR_PARITY, next parity NEXT_PARITY, current maximum FIR output CUR_MAX, and next maximum FIR output NEXT_MAX are initialized to zero. A COUNTER is initialized to 3 to start with the first bit of the first EDC code word of the sector as shown in FIG. 11A.

At step 206, a branch is executed depending on the current COUNTER value which represents a pointer into the FIFO buffer 202. If the COUNTER value is 3 through 71 at step 206, then the remod/demod detector is processing the data bits of a current EDC code word. At step 208, the current parity CUR_PARITY is updated with the current NRZ bit 136 output by the EPR4 sequence detector 134, and at step 210, the current sample error value 144 is filtered by the FIR filters 180 in the error pattern detector 146 of FIG. 9. The FIR filter with the maximum output MAX_FIR that corresponds to a valid correction sequence from Table 4 or Table 5 is selected at step 212, and the selected FIR filter is assigned to CUR_FIR. If the maximum FIR filter output

TABLE 5

SNRZI Error (+1,−2,+2,−1)

| | Expected SNRZI | | | | Corrected SNRZI | | | | | Expected SNRZI | | | | Corrected SNRZI | | | |
|---|---|---|---|---|---|---|---|---|---|---|---|---|---|---|---|---|---|
| E2 | $S_n$ | $S_{n-1}$ | $S_{n-2}$ | $S_{n-3}$ | $S_n$ | $S_{n-1}$ | $S_{n-2}$ | $S_{n-3}$ | E2 | $S_n$ | $S_{n-1}$ | $S_{n-2}$ | $S_{n-3}$ | $S_n$ | $S_{n-1}$ | $S_{n-2}$ | $S_{n-3}$ |
| E2 < 0 | −0 | −1 | +1 | −0 | −1 | +1 | −1 | +1 | E2 > 0 | +0 | +1 | −1 | +0 | +1 | −1 | +1 | −1 |
| E2 < 0 | −0 | −1 | +1 | −1 | −1 | +1 | −1 | +0 | E2 > 0 | +0 | +1 | −1 | +1 | +1 | −1 | +1 | −0 |
| E2 < 0 | +1 | −1 | +1 | −0 | +0 | +1 | −1 | +1 | E2 > 0 | −1 | +1 | −1 | +0 | −0 | −1 | +1 | −1 |
| E2 < 0 | +1 | −1 | +1 | −1 | +0 | +1 | −1 | +0 | E2 > 0 | −1 | +1 | −1 | +1 | −0 | −1 | +1 | −0 |

The error events E1 and E2 can be positive or negative depending on the polarity of the sample error sequence 144. The detected SNRZI sequence stored in the FIFO buffer 188 of FIG. 9 are compared to the "Expected SNRZI" sequences in the above lookup tables to determine whether a valid correction can be made.

MAX_FIR is greater than the current maximum CUR_MAX at step 214, then at step 216 the lookup table 190 of FIG. 9 compares the detected SNRZI sequence stored in FIFO buffer 188 to the expected SNRZI sequences that correspond to the detected error event as shown in Table 4 and Table 5. If there is a match at step 216 indicating that a valid correction can be made, then at step 218 the current maximum CUR_MAX is updated to MAX_FIR, the corresponding location of the detected error LOC[CUR_FIR] is assigned to CUR_LOC, and the corresponding correction sequence from Table 4 or Table 5 is assigned to CUR_COR. If the maximum FIR output MAX_FIR is not greater than the current maximum CUR_MAX at step 214, or if a valid correction cannot be made at step 216, then step 218 is skipped.

Another branch is executed at step 220 based on the current value of the COUNTER. If the COUNTER value is 70 through 74, then the error pattern detector 146 begins searching for the maximum error event in the next EDC code word. At step 222, the maximum FIR output is compared to NEXT_MAX, the maximum value saved for the next EDC code word. If greater, then again the lookup table 190 of FIG. 9 compares the detected SNRZI sequence stored in FIFO buffer 188 to the expected SNRZI sequences stored in Table 4 or Table 5. If there is a match at step 224 indicating that a valid correction can be made, then at step 226 the maximum FIR output for the next EDC code word NEXT_MAX is updated to MAX_FIR, the corresponding location of the detected error LOC[CUR_FIR] is assigned to NEXT_LOC, and the corresponding correction sequence from Table 4 or Table 5 is assigned to NEXT_COR. If the maximum FIR output MAX_FIR is not greater than NEXT_MAX at step 222, or if a valid correction cannot be made at step 224, then step 226 is skipped.

At step 228 the COUNTER is incremented and control branches to the beginning of the loop. If at step 206 the COUNTER value is 72 through 74, then the parity for the current EDC code word has been completely generated. Therefore, the parity for the next EDC code word is updated at step 230 by adding the current NRZ bit to NEXT_PARITY and skipping the parity update for the current EDC code word at step 208.

If the COUNTER value is 75 at step 206, then the error pattern detector 146 has completed processing the current EDC code word. Therefore, at step 232 the parity syndrome for the current EDC code word CUR_PARITY is evaluated. If non-zero, indicating that a detection error occurred, then at step 234 the error is corrected using the current correction sequence CUR_COR stored in register 194 of FIG. 9 and the current location CUR_LOC stored in register 198. Then at step 236, the system variables are re-initialized: the COUNTER is reset to 5; the current parity CUR_PARITY is set to NEXT_PARITY, the parity calculated for the next EDC code word; the current FIR maximum CUR_MAX is set to NEXT_MAX, the maximum FIR output saved for the next EDC code word; and the parity and correction sequence for the next EDC code word, NEXT_PARITY and NEXT_COR, are set to zero. Then the flow diagram of FIG. 10 is re-executed for the next EDC code word until the end of the sector is reached at step 238.

Figure 11B:
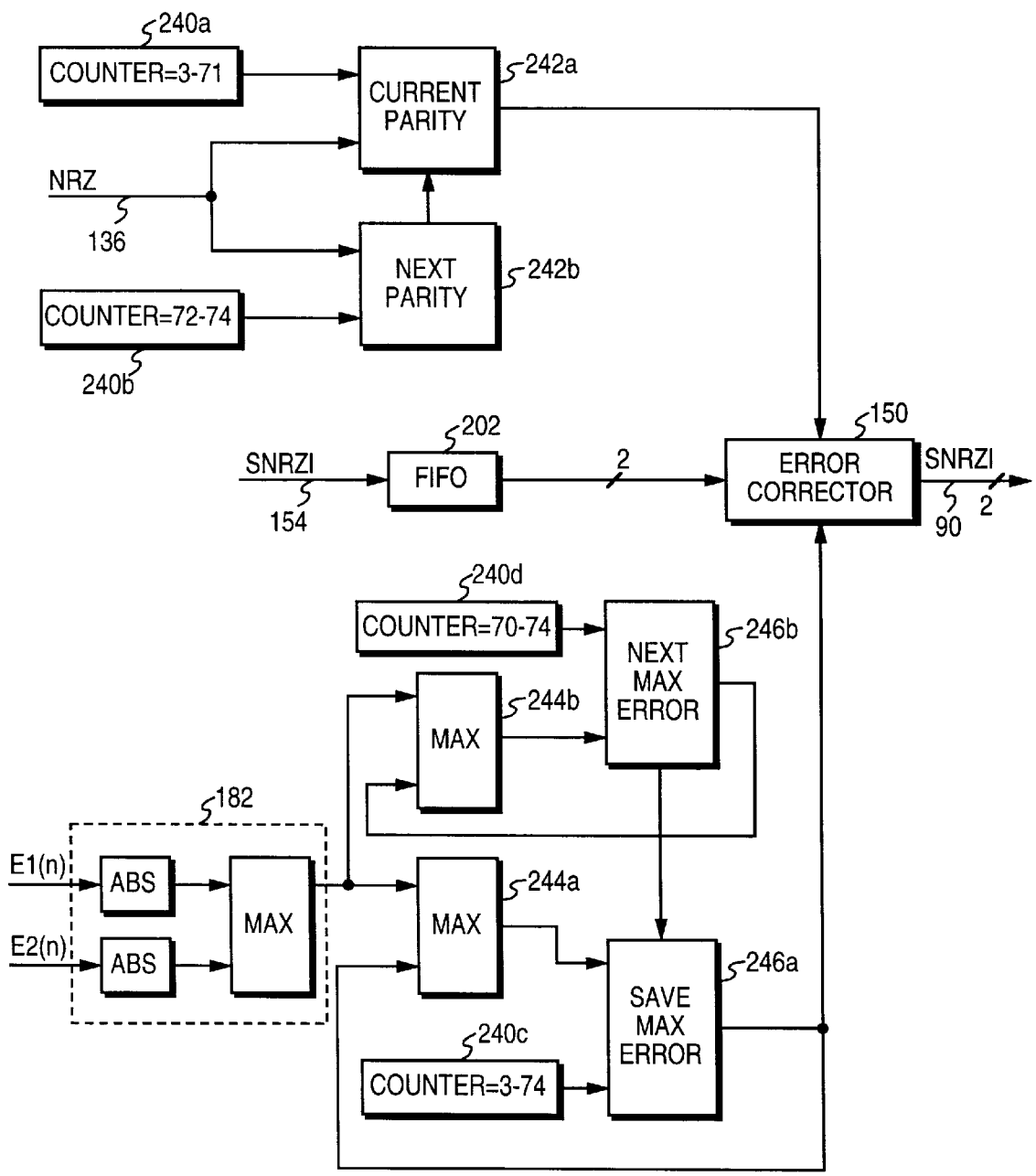

FIG. 11B shows further details of the circuitry employed to track the parity and maximum FIR error events for the current and next EDC code words. The detected NRZ sequence 136 output by the EPR4 sequence detector 134 of FIG. 6 is accumulated for the current and next EDC code words in registers 242a and 242b, respectively. The parity for the current EDC code word is updated when the COUNTER 240a equals 3 through 71, and the parity for the next EDC code word is updated when the COUNTER 240b equals 72 through 74. When the COUNTER equals 75, the parity for the next EDC code word stored in register 242b is transferred to the parity for the current EDC code word in register 242a.

The SNRZI sequence 154 generated by the remodulator 138 of FIG. 6 is buffered in FIFO 202, which is the same FIFO shown in FIG. 11A. When the parity for the current EDC code word stored in register 242a indicates that a detection error was made by the EPR4 sequence detector 134, the error corrector 150 uses the maximum error event detected by the error pattern detector 146 to correct the error in the SNRZI sequence 154.

The two error events E1 (n) and E2 (n) detected by the two FIR error filters 180 of FIG. 9 are compared at comparator 182 and the maximum of the absolute value selected as the output of the comparator 182. The maximum error filter output is compared to the maximum for the current EDC code word at comparator 244a when the COUNTER 240c equals 3 through 74, and to the maximum for the next EDC code word at comparator 244b when the COUNTER 240d equals 70 through 74. The maximum error event (location and correction sequence) for the current EDC code word is stored in register 246a, and the maximum error event for the next EDC code word is stored in register 246b. When the COUNTER equals 75, the maximum error event (location and correction sequence) for the current EDC code word is used to correct the current EDC code word if the current parity stored in register 242a is non-zero. Then the maximum error event (correction and location sequence) for the next EDC code word stored in register 246b is transferred to the current maximum error event stored in register 246a. The COUNTER is reset to 5, and the procedure begins again for the next EDC code word.

Figure 12:
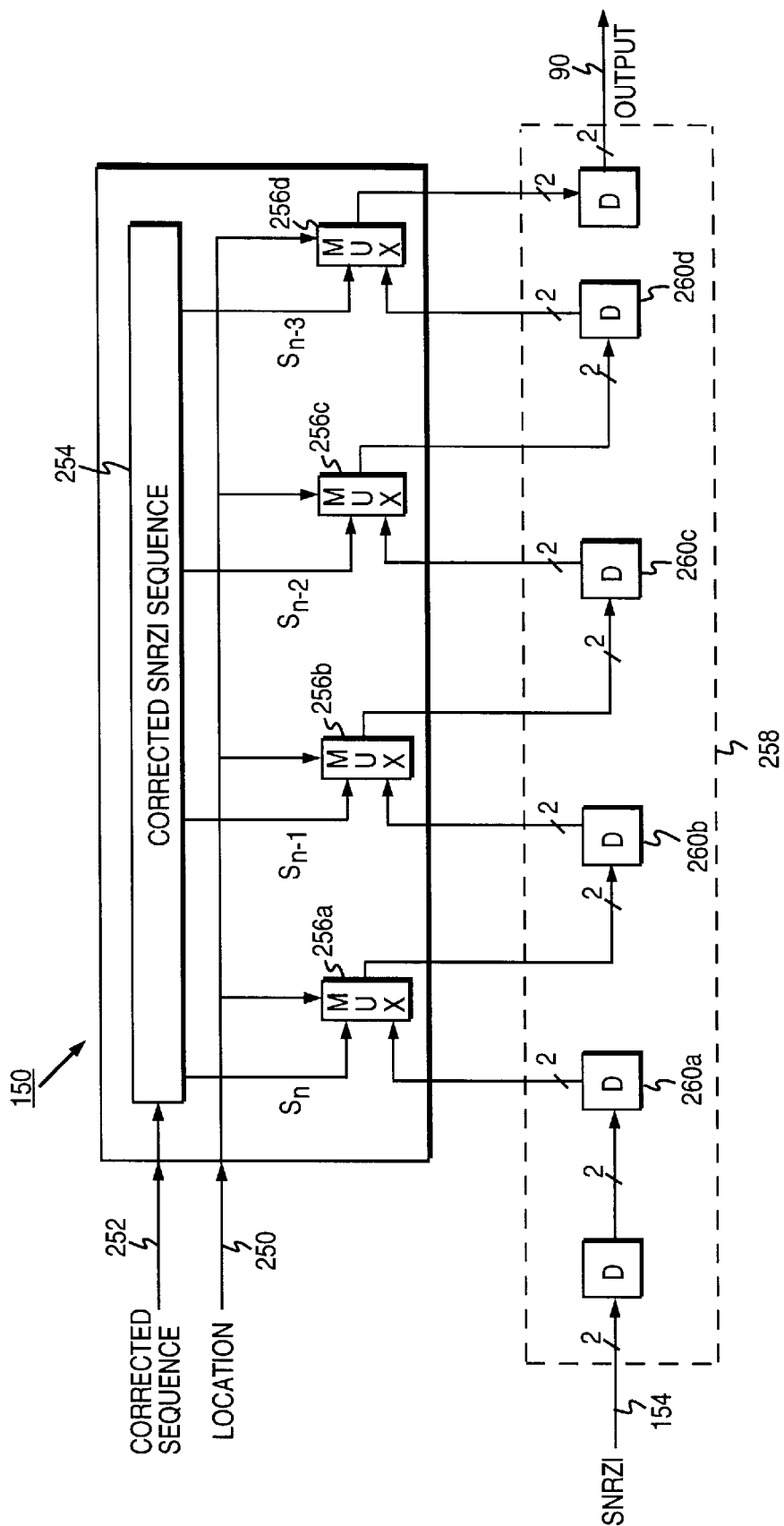
FIG. 12 is a block diagram of the error corrector in the remod/demod sequence detector of the present invention.

A better understanding of how the error corrector 150 of FIG. 6 corrects an error in the detected SNRZI sequence is understood with reference to the block diagram of FIG. 12. When the error syndrome (parity) generated by the syndrome generator 148 of FIG. 6 indicates a detection error occurred in the current EDC code word, the error corrector 150 receives from the PR4/EPR4 error pattern detector 146 of FIG. 9 the location of the maximum error event over line 250 and the corresponding corrected SNRZI sequence over line 252. The corrected SNRZI sequence is stored in register 254 and applied to a first input of multiplexers 256a–256d. The detected SNRZI sequence 154 is shifted through a shift register 258, wherein the output of delay elements 260a–260d are applied to a second input of multiplexers 256a–256d. The location of the maximum error event, LOCATION 250, controls the operation of the multiplexers 256a–256d in order to replace the erroneous bits in the detected SNRZI sequence with the corrected SNRZI sequence at the appropriate time. The output lines of register 254 labeled $S_n$, $S_{n-1}$, $S_{n-2}$ and $S_{n-3}$ correspond to the corrected SNRZI sequences shown in Table 4 and Table 5 discussed above.

The objects of the invention have been fully realized through the embodiments disclosed herein. Those skilled in the art will appreciate that the various aspects of the invention can be achieved through different embodiments without departing from the essential function. Using an EDC error syndrome to guide a remod/demod sequence detector is a broad concept applicable to the prior art as well as to the particular EPR4 remod/demod sequence detector disclosed in FIG. 6. Furthermore, those skilled in the art will appreciate that EDC codes other than parity could be employed to detect when the trellis detector has made a detection error in the preliminary binary sequence. Still further, the EPR4 remod/demod sequence detector of the present invention employes at least two significant ideas: the first is to equalize the channel samples into a PR4 response so that a simple slicer can generate estimated sample values for use by timing recovery, gain control, and the adaptive discrete-time equalizer; and the second is to search for error events in at least two different domains, such as in the PR4 and EPR4 domains. However, the particular embodiments disclosed are illustrative and not meant to limit the scope of the invention as appropriately construed from the following claims.

We claim:

1. A sampled amplitude read channel for reading data recorded on a disk storage medium by detecting data from a sequence of discrete-time sample values generated by sampling pulses in an analog read signal from a read head positioned over the disk storage medium, comprising:

(a) a sampling device for sampling the analog read signal to generate the discrete-time sample values;

(b) a discrete-time equalizer for equalizing the sample values according to a first partial response to generate first equalized sample values;

(c) timing recovery, responsive to the first equalized sample values, for generating synchronous sample values;

(d) a conversion filter for converting the first equalized sample values into second equalized sample values according to a second partial response; and (e) a remod/demod sequence detector for detecting the data from the first and second equalized sample values, comprising:

(i) a demodulator, responsive to the second equalized sample values, for detecting a binary sequence having one or more bit errors;

(ii) a remodulator for remodulating the binary sequence into a sequence of estimated sample values;

(iii) an error value generator, responsive to the first equalized sample values and the estimated sample values, for generating a sequence of sample error values;

(iv) an error pattern detector, responsive to the sequence of sample error values, for detecting a magnitude and location of the bit errors in the binary sequence; and (v) an error corrector, responsive to the magnitude and location of the bit errors, for correcting the binary sequence.

2. The sampled amplitude read channel as recited in claim 1, further comprising a sample value estimator, responsive to the first equalized sample values, for generating sample value estimates used by timing recovery.

3. The sampled amplitude read channel as recited in claim 2, wherein the discrete-time equalizer is adapted in real time using the sample value estimates.

4. The sampled amplitude read channel as recited in claim 1, wherein the conversion filter comprises a 1+D filter.

5. The sampled amplitude read channel as recited in claim 1, wherein the first partial response is PR4 and the second partial response is EPR4.

6. The sampled amplitude read channel as recited in claim 5, wherein the demodulator is an EPR4 trellis sequence detector.

7. The sampled amplitude read channel as recited in claim 1, wherein the remodulator comprises a NRZI converter for converting the binary sequence into a NRZI sequence.

8. The sampled amplitude read channel as recited in claim 1, wherein the remodulator comprises a partial erasure compensator which compensates for the non-linear reduction in amplitude of a primary pulse caused by secondary pulses located near the primary pulse.

9. The sampled amplitude read channel as recited in claim 1, wherein the error pattern detector comprises a discrete-time filter matched to a predetermined error event of the demodulator.

10. The sampled amplitude read channel as recited in claim 9, wherein the discrete-time filter is programmably configurable to detect the error event in one of a plurality of partial response domains.

11. The sampled amplitude read channel as recited in claim 1, further comprising a means for converting the sequence of sample error values from a first partial response domain to a second response domain, wherein the error pattern detector detects the bit errors in the second partial response domain.

12. The sampled amplitude read channel as recited in claim 11, wherein:

(a) the first partial response is PR4 and the second partial response is EPR4; and (b) the error pattern detector detects a first error event in the PR4 domain and a second error event in the EPR4 domain.

13. The sampled amplitude read channel as recited in claim 1, further comprising an error detection validator for checking the validity of a detected error event.

14. The sampled amplitude read channel as recited in claim 1, further comprising a syndrome generator, responsive to the binary sequence, for generating an error syndrome corresponding to the one or more bit errors, wherein the error corrector corrects an error in the detected binary sequence when the error syndrome indicates that the binary sequence contains an error.

15. The sampled amplitude read channel as recited in claim 14, further comprising a data buffer for buffering a predetermined number of bits in the detected binary sequence, wherein:

(a) the error pattern detector detects a plurality of potential error events within the binary sequence buffered in the data buffer; and (b) the error pattern detector evaluates the error events to determine the error event most likely to have actually caused an error in the detected binary sequence.

16. A sampled amplitude read channel for reading data recorded on a disk storage medium by detecting data from a sequence of discrete-time sample values generated by sampling pulses in an analog read signal from a read head positioned over the disk storage medium, comprising:

(a) a sampling device for sampling the analog read signal to generate the discrete-time sample values;

(b) a discrete-time equalizer for equalizing the sample values according to a first a PR4 response to generate PR4 sample values;

(c) timing recovery, responsive to the PR4 sample values, for generating synchronous sample values;

(d) a 1+D conversion filter for converting the PR4 sample values into EPR4 sample values; and (e) a remod/demod sequence detector for detecting the data from the PR4 and EPR4 sample values, comprising:

(i) an EPR4 sequence detector, responsive to the EPR4 sample values, for detecting a binary sequence having one or more bit errors;

(ii) a remodulator for remodulating the binary sequence into a sequence of estimated sample values;

(iii) an error value generator, responsive to the PR4 sample values and the estimated sample values, for generating a sequence of sample error values;

(iv) an error pattern detector, responsive to the sequence of sample error values, for detecting a magnitude and location of the bit errors in the binary sequence; and (v) an error corrector, responsive to the magnitude and location of the bit errors, for correcting the binary sequence.

17. The sampled amplitude read channel as recited in claim 16, wherein the error pattern detector comprises a discrete-time filter programmably configurable to detect an error event of the EPR4 sequence detector in one of a plurality of partial response domains.

18. The sampled amplitude read channel as recited in claim 16, wherein the error pattern detector comprises a first finite-impulse-response filter matched to a first error event in the PR4 domain, and a second finite-impulse-response filter matched to a second error event in the EPR4 domain.

19. The sampled amplitude read channel as recited in claim 16, further comprising a syndrome generator, responsive to the binary sequence, for generating an error syndrome corresponding to the one or more bit errors, wherein the error corrector corrects an error in the detected binary sequence when the error syndrome indicates that the binary sequence contains an error.

20. The sampled amplitude read channel as recited in claim 16, further comprising a slicer, responsive to the PR4 sample values, for generating sample value estimates used by timing recovery.

21. The sampled amplitude read channel as recited in claim 20, wherein the discrete-time equalizer is adapted in real time using the sample value estimates.

22. A method for reading data recorded on a disk storage medium by detecting data from a sequence of discrete-time sample values generated by sampling pulses in an analog read signal from a read head positioned over the disk storage medium, comprising the steps of:

(a) sampling the analog read signal to generate the discrete-time sample values;

(b) equalizing the sample values according to a first partial response to generate first equalized sample values;

(c) generating synchronous sample values from the first equalized sample values;

(d) converting the first equalized sample values into second equalized sample values according to a second partial response;

(e) demodulating the second equalized sample values into a binary sequence having one or more bit errors;

(f) remodulating the binary sequence into a sequence of estimated sample values;

(g) generating a sequence of sample error values from the first equalized sample values and the estimated sample values;

(h) detecting a magnitude and location of the bit errors in the binary sequence from the sequence of sample error values; and (i) correcting the bit errors in the binary sequence using the magnitude and location of the bit errors.

* * * * *